(12) United States Patent
Classen

(10) Patent No.: US 12,703,623 B2
(45) Date of Patent: Aug. 11, 2026

(54) MICROMECHANICAL Z-ACCELERATION SENSOR WITH REFERENCE ELECTRODE

(71) Applicant: Robert Bosch GmbH, Stuttgart (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 439 days.

(21) Appl. No.: 18/525,319

(22) Filed: Nov. 30, 2023

(65) Prior Publication Data

US 2024/0182296 A1 Jun. 6, 2024

(30) Foreign Application Priority Data

Dec. 5, 2022 (DE) ..................... 10 2022 213 059.6

(51) Int. Cl.
*B81B 7/02* (2006.01)
*G01P 15/125* (2006.01)
*G01P 15/08* (2006.01)

(52) U.S. Cl.
CPC .............. *B81B 7/02* (2013.01); *G01P 15/125* (2013.01); *B81B 2201/0235* (2013.01); *G01P 2015/0814* (2013.01)

(58) Field of Classification Search
CPC ... B81B 7/02; B81B 2201/0235; B81B 7/007; G01P 15/125; G01P 2015/0814; G01P 15/18; G01P 2015/0831; G01P 15/0802
See application file for complete search history.

(56) References Cited

U.S. PATENT DOCUMENTS 5,668,318 A * 9/1997 Okada ........................ G01P 3/44 73/862.043
5,747,991 A * 5/1998 Ito .......................... G01P 15/125 324/661

(Continued)

FOREIGN PATENT DOCUMENTS

DE 102009029095 A1 3/2011
DE 102009045391 A1 4/2011

(Continued)

OTHER PUBLICATIONS

Hammond et al., "Inertial Transducer Design for Manufacturability and Performance at Motorola," Transducers '03, 12th International Conference on Solid-State Sensors, Actuators and Microsystems, vol. 1, 2003, pp. 85-90. <https://sci-hub.ru/10.1109/sensor.2003.1215259> Downloaded Nov. 27, 2023.

*Primary Examiner* — David J Bolduc
(74) *Attorney, Agent, or Firm* — Norton Rose Fulbright US LLP

(57) ABSTRACT

A micromechanical capacitive z-acceleration sensor. The sensor includes a substrate with a main extension plane and a layer sequence which is parallel to the extension plane, and includes a first polysilicon layer, a second polysilicon layer, and a third polysilicon layer, with a movable micromechanical structure having a seismic mass which can be deflected in a straight line in a first direction perpendicular to the extension plane. The movable micromechanical structure is formed in the second polysilicon layer and the third polysilicon layer. A measuring capacitance is formed between the seismic mass and a measuring electrode formed in the first polysilicon layer. A reference capacitance is formed between lower and upper reference electrodes, which are formed in the first and polysilicon layers, respectively. As viewed in the first direction, the movable micromechanical (Continued)

structure at least partially overlaps the upper reference electrode.

10 Claims, 10 Drawing Sheets

(56) References Cited

U.S. PATENT DOCUMENTS 6,892,576 B2 5/2005 Samuels et al.
11,125,771 B2* 9/2021 Reinmuth ............. G01P 15/125
2003/0132493 A1* 7/2003 Kang .................. G01P 15/0802 257/420
2006/0037397 A1* 2/2006 Memishian ............. G01P 15/18 73/514.32
2006/0141786 A1* 6/2006 Boezen ............... G01P 15/0802 438/689
2006/0202591 A1* 9/2006 Inaguma ............. G01P 15/0802 310/348
2010/0058865 A1* 3/2010 Zhang ................. G01P 15/0802 73/514.38
2010/0107762 A1* 5/2010 Classen ............... G01P 15/0802 29/829
2010/0242600 A1* 9/2010 Lin ........................ G01P 15/18 73/514.32
2011/0296917 A1* 12/2011 Reinmuth .............. G01B 7/085 29/829
2012/0223726 A1* 9/2012 Zhang ................... G01P 15/125 257/417
2013/0285168 A1* 10/2013 Wang .................. B81C 1/00293 257/415
2013/0285172 A1* 10/2013 Jeong .................... G01P 15/125 257/415
2013/0299923 A1* 11/2013 Classen ................. B81B 3/0051 257/415
2014/0270231 A1 9/2014 Dusan et al.
2015/0041927 A1* 2/2015 Geisberger ............ B81B 3/0078 438/52
2015/0355222 A1* 12/2015 Zhang ................... B81B 3/0094 73/514.32
2018/0044174 A1* 2/2018 Zheng ................. B81C 1/00269
2019/0310086 A1* 10/2019 Takahashi .......... G01C 19/5649
2020/0081028 A1* 3/2020 Zhang ................... G01P 15/125
2021/0341510 A1* 11/2021 Classen ................. G01P 15/125
2022/0326105 A1* 10/2022 Tebje .................... G01L 9/0072
2023/0375424 A1* 11/2023 Weber ..................... G01L 19/14
2024/0103035 A1* 3/2024 Classen ................. B81B 3/0051
2024/0383745 A1* 11/2024 Weber ................... B81B 7/0006
2025/0198867 A1* 6/2025 Classen ................. G01L 9/0072

FOREIGN PATENT DOCUMENTS

DE 102012200740 A1 5/2013
DE 102018211280 A1 1/2020
DE 102018222615 A1 6/2020
DE 102019216984 A1 5/2021
EP 0244581 A1 11/1987
EP 0773443 A1 5/1997

* cited by examiner x
y x
z

B
30
A
40
50
P2
P1
O1
1
30
A B
50
10

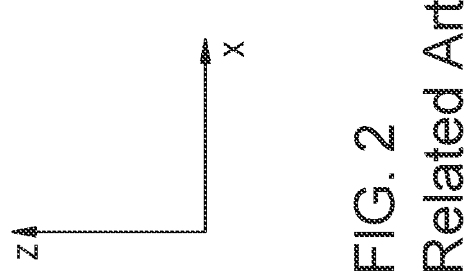
FIG. 2
Related Art
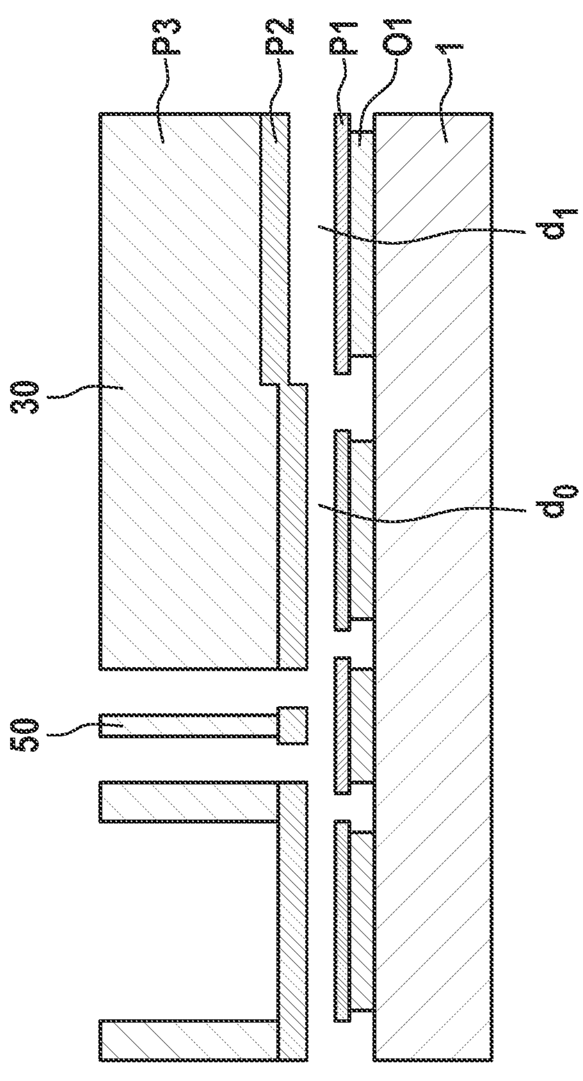

X
Z

A B
30
40
30
40
30
40
25
15
10
10
15
25
1
X
Z

C D
30
50
30
50
30
P3
P2
P1
O1
10
10
1 x
y 111
121
120
110
35
11
30
10
50
40

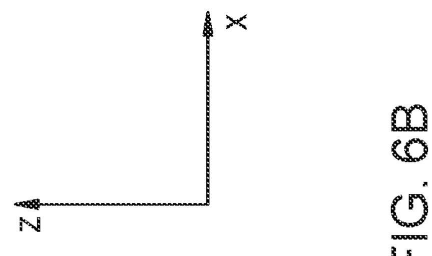
FIG. 6B
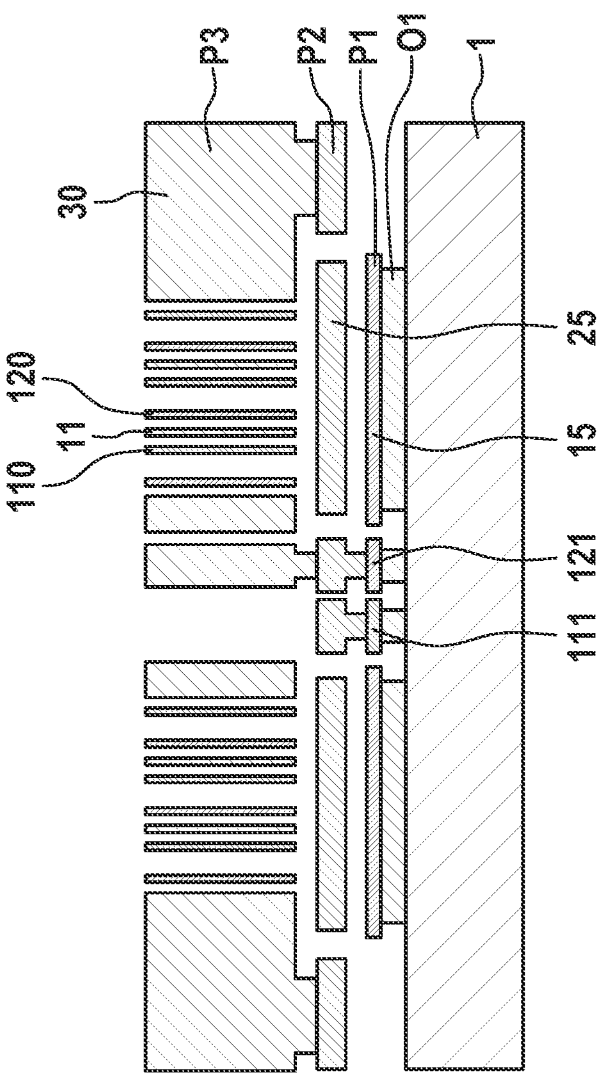

40
50
30

40
50
30

40
50
30
y
x

MICROMECHANICAL Z-ACCELERATION SENSOR WITH REFERENCE ELECTRODE

CROSS REFERENCE

The present application claims the benefit under 35 U.S.C. § 119 of German Patent Application No. DE 10 2022 213 059.6 filed on Dec. 5, 2022, which is expressly incorporated herein by reference in its entirety.

BACKGROUND INFORMATION

Micromechanical inertial sensors for measuring acceleration and rotation rate are mass-produced for various applications in vehicles and consumer products. For capacitive acceleration sensors with a detection direction perpendicular to the wafer plane (z-direction), “rocker structures” are often used, as shown by way of example in FIGS. 1A and 1B in plan view and in cross-section. The sensor principle of these rocker structures is based on a spring-mass system in which, in the simplest case, a movable seismic mass (realized in the P3 layer) with two counter-electrodes (P1 layer, which is arranged on an insulation layer shown in orange above the substrate) fastened on the substrate forms two plate capacitors. The seismic mass is connected to the base via at least one but usually, for reasons of symmetry, two torsion springs. If the mass structures at the two ends of the torsion spring are of different sizes, the mass structure will rotate relative to the torsion spring as a rotational axis when a z-acceleration acts on it. Depending on the sign of the acceleration, the distance between the electrodes is thus smaller at the one end and greater at the other end. The capacitance change is a measure of the acting acceleration. Such acceleration sensors are described in numerous publications, for example in European Patent Nos. EP 0244581 A1 and EP 0773443 A1.

The perforation holes in the mass structure in FIG. 1A serve, on the one hand, for a simplified exposure of the sensor structure if, as is customary in surface-micromechanical process sequences, a sacrificial oxide must be removed. Due to the perforation holes, the etching medium, for example gaseous HF, has easier access to the sacrificial oxide. On the other hand, via a suitable number and dimensioning of the perforation holes, the Lehr’s damping (the damping ratio D) can be modified over a wide range and adjusted as desired. However, for reasons of simplicity the representation of perforation holes is omitted below.

An important trend in the development of acceleration sensors is to improve the performance parameters. In certain applications, for example for earphones, the reduction of noise is primarily of great importance. Possible applications for an acceleration sensor in miniaturized earphones are, for example, described in U.S. Patent Application Publication No. US 2014/0270231 A1.

The noise of a typical MEMS acceleration sensor is dominated by two noise sources: electronic noise and Brownian (mechanical) noise. Which of the two noise sources dominates is product-specifically dependent on the evaluation circuit, i.e., the ASIC on the one hand and the MEMS element on the other hand. The Brownian noise of a MEMS acceleration sensor is caused by statistical shocks and the resulting impulse transfer between the seismic mass and surrounding gas molecules. For a linearly deflectable sensor with a seismic mass $m_s$, the following results as the noise power density $$\frac{a}{\sqrt{\Delta f}} = \sqrt{\frac{8\ k_B T\ D\ \omega_0}{m_s}}$$

wherein a denotes the acceleration, f the frequency interval under consideration, $k_B$ the Boltzmann constant, T the temperature, D the Lehr’s damping, and o the angular frequency of the sensor.

A somewhat more complex relationship results for a z-acceleration sensor according to the rocker principle $$\frac{a}{\sqrt{\Delta f}} = \sqrt{\frac{8\ k_B T\ D\ \omega_0\ J}{m_{asym} r_{asym}}}$$

Here, J denotes the moment of inertia about the torsion axis, $m_{asym}$ the mass asymmetry, and $r_{asym}$ the distance of the center of gravity of the mass asymmetry from the torsion axis. Without mass asymmetry, the noise power density diverges since the mechanical sensitivity of the sensor then disappears. In the case of very large mass asymmetries, J scales approximately with $m_{asym}*r_{asym}^2$ so that the formula for the z-rocker then transitions approximately into the upper formula for the translationally moved sensor, with the difference that the entire sensor mass has a noise-reducing effect in the translational case, whereas only the asymmetrical mass fraction has a noise-reducing effect in the case of the z-rocker. This means that, due to the underlying principle, acceleration sensors with a rocker geometry have a disadvantage compared to acceleration sensors moved translationally, i.e., in a straight line in the z-direction (hereinafter also referred to as a trampoline structure), since the entire mass in the latter contributes to the mechanical sensitivity and thus to the reduction of the Brownian noise. On the same sensor surface area, a better acceleration sensor as regards mechanical noise can therefore be realized with a trampoline structure.

FIG. 2 shows an improved version of an acceleration sensor in rocker geometry, as described in German Patent Application No. DE 10 2019 216 984 A1. In this sensor, the movable structure is formed from two micromechanical functional layers P2 and P3 made of polysilicon; in addition, in order to prevent premature striking of the right-hand rocker end, the base distance $d_1$ can be selected to be somewhat larger in the outer region than in the region of the evaluation electrodes at base distance $d_0$. The mass asymmetry and thus the mechanical sensitivity of the sensor is increased in that the movable structure on the left-hand side of the torsion spring is designed as a type of trough. However, even this arrangement is not as efficient at reducing mechanical noise as a trampoline structure. In addition, only relatively small mechanical deflections occur under the action of an acceleration in the region of the evaluation electrodes since the electrode regions are arranged in a region close to the torsion spring. This also results in a comparatively low electrical sensitivity dC/da (capacitance change per acceleration), which in turn enters directly into the electronic noise. In other words, rocker structures are not the optimal basic arrangement as regards mechanical Brownian noise or electronic noise. The advantage of the rocker structures is primarily that the two evaluation capacitances C1 and C2 are defined via the same process steps and can be formed completely symmetrically by design; the basic signal is therefore largely offset-free. Since the electrode regions are also arranged in the vicinity of the mechanical anchoring of the sensor, the sensor is also comparatively robust as regards mechanical stress in comparison to trampoline structures since mechanical stress can basically lead to substrate bending and thus to distance changes in the region of the evaluation electrodes and consequently to offset signals, i.e., a non-zero signal, even in the absence of any acceleration.

A z-acceleration sensor with three micromechanical functional layers and with a seismic mass in the form of a trampoline structure is described in the paper B. J. Hammond, A. McNeil, R. August and D. Koury, "Inertial transducer design for manufacturability and performance at Motorola, " TRANSDUCERS '03. 12th International Conference on Solid-State Sensors, Actuators and Microsystems. Digest of Technical Papers (cat. no. 03TH8664) , 2003, pp. 85-90 vol.1, doi: 10.1109/SENSOR.2003.1215259. In this sensor, a seismic mass elastically suspended from four springs moves translationally in the z-direction between a bottom electrode arranged on the substrate and a top electrode arranged above the movable mass. A differential capacitance evaluation dC=C1−C2 is thus possible, in which the one evaluation capacitance C1 (e.g., toward the bottom electrode) is reduced in the case of a z-deflection of the mass and the other evaluation capacitance C2 (toward the top electrode) is increased. The basic principle of this arrangement is shown in simplified form in FIG. 3A. Due to the differential electrode arrangement, the arrangement is advantageous with respect to a high electrical signal (in relation to the surface area) but has one serious disadvantage. The distances between the underside of the seismic mass and the bottom electrode (and thus the capacitance C1) and the distances between the upper side of the seismic mass and the top electrode (and thus the capacitance C2) are subject to certain fluctuations due to manufacturing tolerances (the two distances are defined by separate layer deposition processes) so that the evaluation capacitances C1 and C2 can differ markedly from one another in the mass production of such sensors. This results in large offset errors in the differential evaluation dC=C1−C2. Although the initial offset error can be corrected during the final test of the component, the gaps generally do not change to the same extent but somewhat differently under the action of temperature changes and/or mechanical stress. Overall, this arrangement therefore results in a poor offset performance which is inadequate for many applications. A further challenge is the mechanical robustness of the arrangement. At high shock loading, the seismic mass may in some circumstances strike the self-supporting top electrode and break it out or at least severely damage it.

A z-acceleration sensor with two micromechanical functional layers and with a seismic mass in the form of a trampoline structure is described in U.S. Pat. No. 6,892, 576 B2. In this sensor, no top electrode is arranged above the movable mass. Rather, the differential signal evaluation is formed here via a fixed reference capacitance. According to the related art, such reference capacitances are formed either in the surface-micromechanical layers of the MEMS chip or in the evaluation ASIC. In a suitable design, the arrangement in the MEMS chip can have the advantage that at least some of the manufacturing tolerances of the evaluation capacitance C1 also affect the reference capacitance C2 in the same way. FIGS. 3B and 3C show possible embodiments of the reference capacitance in the MEMS chip. FIG. 3B represents a comparatively compact arrangement which exploits the fact that an oxide has a dielectric constant of typically approximately 3.8 so that only a rather small additional surface area in comparison to the evaluation capacitance is required to form the reference capacitance. However, in this case, the match between evaluation capacitance C1 and reference capacitance C2 is by no means perfect since tolerances of the etching of the perforation holes (which are missing in the reference electrode of FIG. 3B since the underlying oxide would otherwise be removed), of the oxide etching (how much of the reference electrode surface is actually filled with oxide?) or of the stress gradient of the exposed structure (this gradient can lead to the bulging of an exposed structure so that a changed average base distance and thus a changed evaluation capacitance can arise in the region of the evaluation electrode) can still occur. A better match of evaluation capacitance and reference capacitance is therefore achieved with an arrangement as in FIG. 3C, in which the sacrificial oxide is also removed in the region of the reference capacitance. However, this arrangement requires a sizable additional surface area since the reference capacitance here requires the same surface area as the evaluation capacitance. In both arrangements 3B, 3C, the reference capacitance is arranged at a lateral distance from the seismic mass or the evaluation capacitance, and thus results in an increase in the chip surface of the sensor. Due to the lateral spacing between evaluation capacitance and reference capacitance, locally different stress effects can also occur at both electrodes, e.g., due to soldering, temperature changes or service life effects, so that considerable offset errors are also to be expected in this case.

In summary, it can be noted that rocker geometries according to the related art tend to be well-suited for high offset stability requirements but are little efficient for achieving low noise values. Conversely, trampoline structures are better suited to achieving low noise values but usually have considerable deficiencies as regards the attainable offset stability.

SUMMARY

An object of the present invention is to provide a compact, low-noise and offset-stable z-acceleration sensor which overcomes both low noise values and the aforementioned disadvantages as regards attainable noise values and attainable offset stability.

The present invention relates to a micromechanical capacitive z-acceleration sensor with a substrate with a main extension plane (x, y) and a layer sequence which is parallel to the extension plane and includes a first polysilicon layer above the substrate, a second polysilicon layer above the first polysilicon layer, and a third polysilicon layer above the second polysilicon layer. The sensor has a movable micromechanical structure with a seismic mass (30) which can be deflected in a straight line in a first direction z perpendicular to the extension plane (x, y), wherein the seismic mass is formed in the second polysilicon layer and the third polysilicon layer. The sensor has a measuring capacitance which is formed between the seismic mass and a measuring electrode, wherein the measuring electrode is formed in the first polysilicon layer. The sensor also has a reference capacitance which is formed between a lower reference electrode and an upper reference electrode, wherein the lower reference electrode is formed in the first polysilicon layer and the upper reference electrode is formed in the second polysilicon layer, wherein, as viewed in the first direction z, the movable micromechanical structure at least partially overlaps the upper reference electrode.

A main feature of the present invention is the arrangement of a seismic mass, in particular a trampoline structure, that can be deflected in a straight line in the z-direction, for a z-acceleration sensor and in which the reference capacitances are not arranged next to the seismic mass but below the seismic mass. A conventional surface-micromechanical process flow with three polysilicon layers P1, P2, P3 can be used to produce such an arrangement. Both the measuring capacitance and the reference capacitance are formed between the P1 layer and the P2 layer so that a good match of the distances from the evaluation electrode and the reference bottom electrode, and thus of the associated capacitances, is ensured. The seismic mass is formed from the P2 layer and the P3 layer, wherein a portion of the seismic mass is preferably formed only in the P3 layer and has an at least partial overlap with the stationary reference electrode in the P2 layer. In this arrangement, surface areas are advantageously used simultaneously for forming the seismic mass and for realizing the reference capacitance, i.e., the arrangement is particularly compact and also has the options and advantages presented below.

Particularly preferably, the sacrificial oxides in the region of the reference electrode are removed. This results in a particularly good match between evaluation capacitance C1 and reference capacitance C2. The evaluation signal dC=C1−C2 is therefore ideally virtually offset-free.

Not only the evaluation electrodes but also the reference electrodes are arranged at a short distance from the anchorings of the sensor structure. As a result, the sensor becomes comparatively insensitive to mechanical stress.

Preferably, a first portion of the evaluation electrodes and a first portion of the reference electrodes have a greater distance from the center, or the center of mass, of the sensor, and a second portion of the evaluation electrodes and a second portion of the reference electrodes have a smaller distance from the center, or the center of mass, of the sensor. Simply expressed, the electrode regions should surround the anchorings. As a result, the sensor becomes particularly insensitive to mechanical stress and becomes particularly offset-stable.

The free reference electrode (s) can be connected directly to the anchorings of the structure in the P2 layer. This arrangement is particularly compact, particularly simple as regards the electrical contacting of the reference electrode and particularly favorable as regards the arrangement of the reference electrode near the anchoring in order to achieve high offset stability.

The sensor can be expanded by means of suitable spring geometries and by adding evaluation electrodes for the x- and y-detection to form a three-axis sensor. This is particularly advantageous since the seismic mass acts in all three spatial directions simultaneously in a manner reducing mechanical noise. In comparison to a side-by-side arrangement of three single-axis sensor cores on a chip, the same noise performance can thus be achieved on a substantially smaller surface area, or a significantly better noise performance can thus be achieved if the same total surface area is assumed.

The evaluation electrodes for the x- and/or y-detection can have a partial overlap with the reference electrodes for the z-axis. That is to say, apart from the aforementioned possibility of the seismic mass overlapping the reference electrodes for the z-axis, there is the possibility of the x/y electrode fingers overlapping the reference electrodes for the z-axis. In this way too a particularly good surface utilization is achieved.

Furthermore, it is possible for the springs to have a partial overlap with the reference electrodes for the z-axis. In this way too a particularly good surface utilization is achieved.

Preferably, the sensor has four anchorings of the seismic mass to the substrate. This ensures a good symmetry of the arrangement in relation to the x- and y-axes.

The sensor preferably has four springs which connect the seismic mass to the anchorings. This ensures a good symmetry of the arrangement; in addition, useful-mode frequencies can be adjusted in a targeted manner in all spatial directions and interference modes can be effectively suppressed.

The springs preferably have a meandering structure with a plurality of spring beams arranged at an angle to one another.

Alternatively and particularly preferably, the springs have a spiral structure with a plurality of spring legs, or roundly or elliptically shaped spiral arms, arranged at an angle to one another. The spiral shape permits a particularly high resilience in the z-direction in comparison to the x- and y-directions so that the mechanical and/or electrical sensitivity of the sensor can be designed similarly in all three spatial directions.

The sensor can be integrated very well with a rotation rate sensor and/or further acceleration sensor cores on one and the same chip since, unlike in the case of rocker designs, very small electrode gaps are not needed to achieve very low noise values. The same electrode gaps as for the rotation rate sensor and the further acceleration sensor cores can therefore be used in the trampoline. This facilitates process integration since the realization of electrode gaps of different sizes would mean considerable additional effort in the manufacture of the sensors.

BRIEF DESCRIPTION OF THE DRAWINGS

FIG. 2 schematically shows a cross-section of a z-acceleration sensor with three polysilicon layers, with a micromechanical rocker structure in the related art.

FIGS. 6A and 6B schematically show a plan view and a section of a z-acceleration sensor according to the present invention with two further measuring axes in a third exemplary embodiment.

DETAILED DESCRIPTION OF EXAMPLE EMBODIMENTS

Figures 1A, 1B:
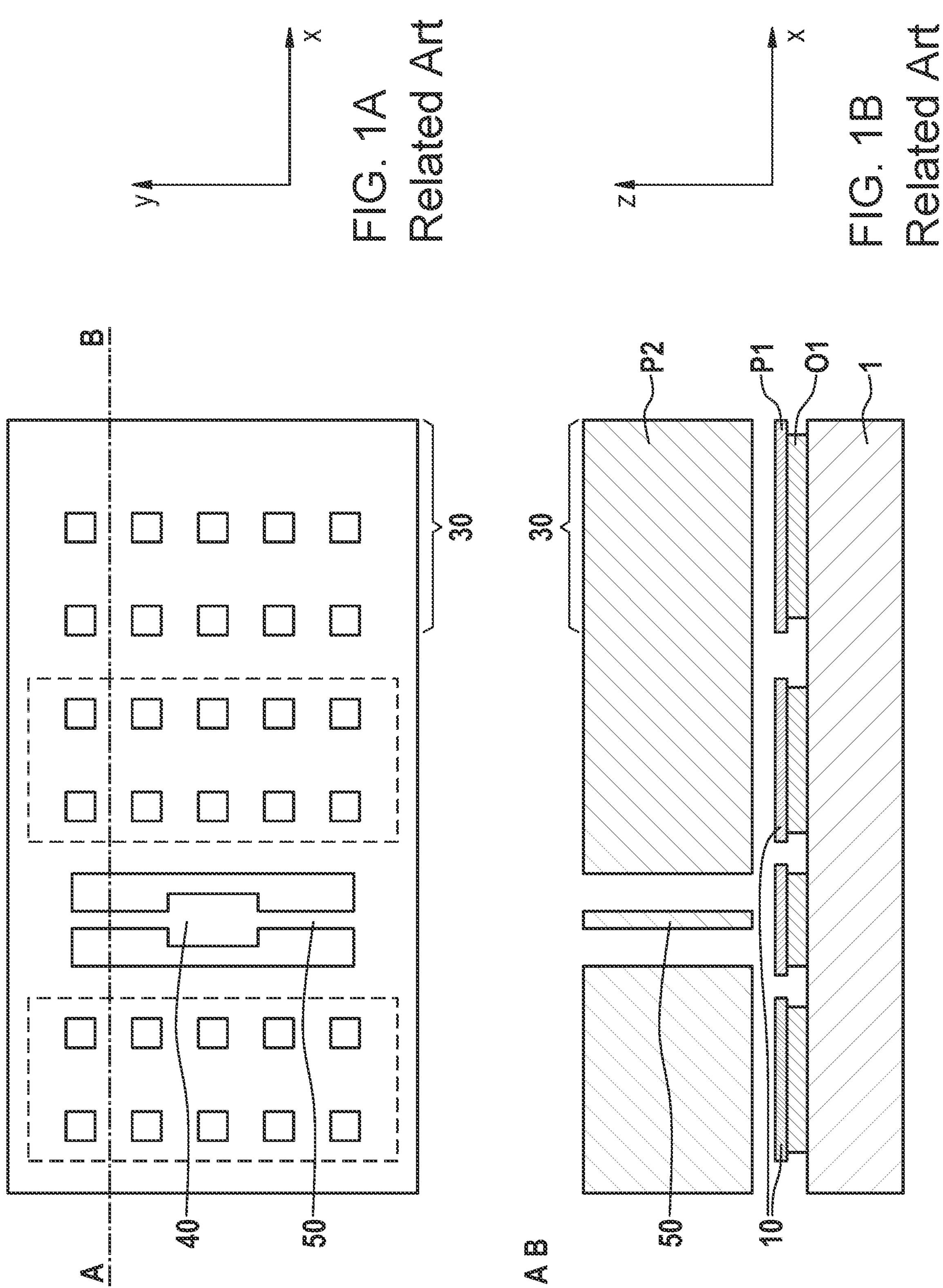
FIGS. 1A and 1B schematically show a plan view and a cross-section of a z-acceleration sensor with two polysilicon layers, with a micromechanical rocker structure in the related art.

FIGS. 1A and 1B schematically show a plan view and a section AB of a z-acceleration sensor with two polysilicon layers, with a micromechanical rocker structure in the related art. On a substrate 1, the sensor has a first oxide layer O1 and thereon a first polysilicon layer P1. Measuring electrodes 10 are structured into the first polysilicon layer. A thicker second polysilicon layer P2 is arranged above the first polysilicon layer. A movable micromechanical structure with a seismic mass 30 and suspension springs 50 in the form of torsion springs is formed in the second silicon layer and anchored to the underlying substrate by means of an anchoring 40.

FIG. 2 schematically shows a cross-section of a z-acceleration sensor with three polysilicon layers, with a micromechanical rocker structure in the related art. On a substrate 1, the sensor has a first oxide layer O1 and thereon a first polysilicon layer P1. Measuring electrodes 10 are structured into the first polysilicon layer. A second polysilicon layer P2 is arranged above the first polysilicon layer, and a thicker third polysilicon layer P3 in which a movable micromechanical structure is formed is arranged on the second polysilicon layer. This structure, which is arranged on two sides of a suspension spring 50, has a trough-shaped portion and a filled portion. An asymmetrically arranged seismic mass 30 is thereby formed. The suspension spring is a torsion spring and enables a deflection of the seismic mass as a result of an acceleration of the sensor in a direction z perpendicular to a main extension plane (x, y) of the substrate. In order to prevent premature striking of the right rocker end, a base distance $d_1$ has been selected to be somewhat larger in the outer region than in the region of the evaluation electrodes at base distance $d_0$.

Figure 3A:
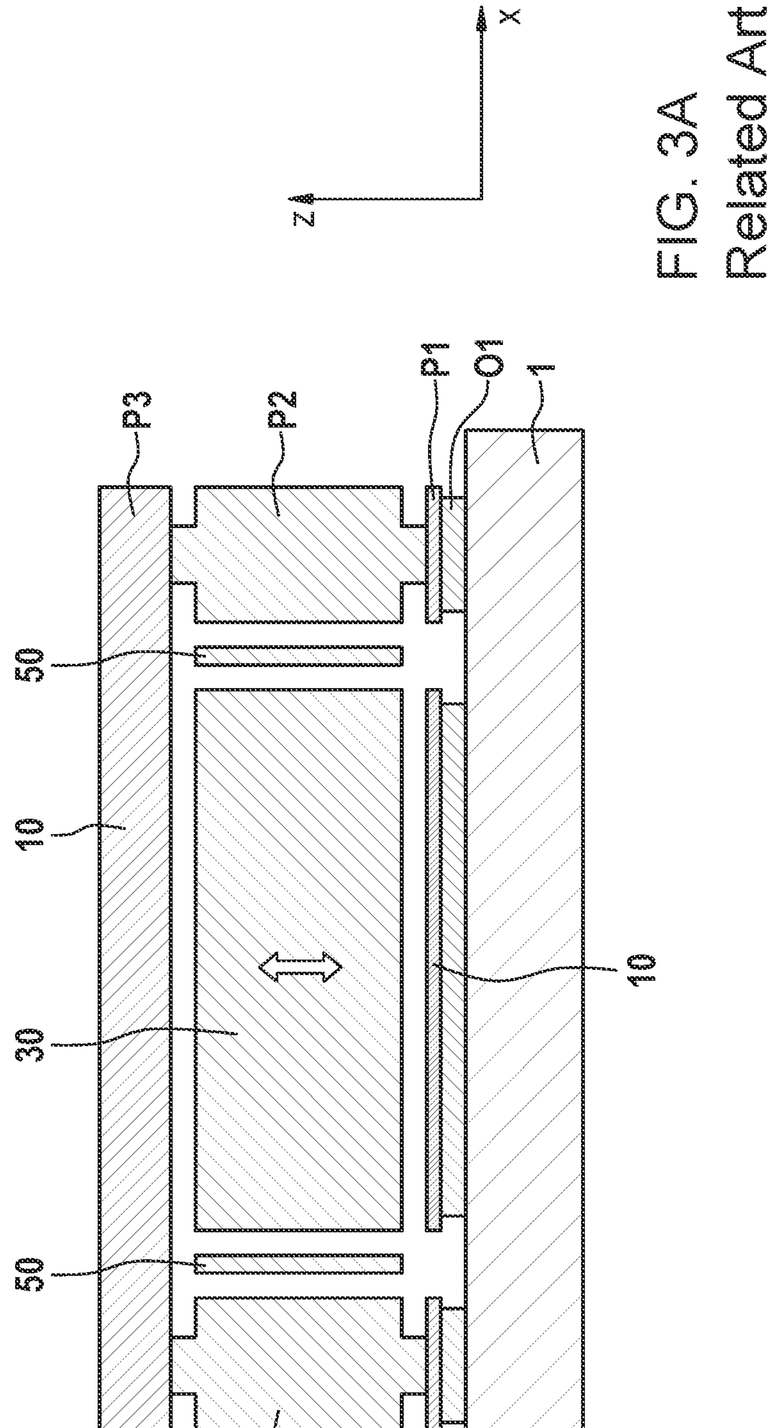
FIG. 3A schematically shows a cross-section of a z-acceleration sensor with three polysilicon layers, with a micromechanical trampoline structure in the related art.

FIG. 3A schematically shows a cross-section of a z-acceleration sensor with three polysilicon layers with a micromechanical trampoline structure in the related art. On a substrate 1, the sensor has a first oxide layer O1 and thereon a first polysilicon layer P1. A measuring electrode 10, the bottom electrode, is structured into the first polysilicon layer. A thicker second polysilicon layer P2 is arranged above the first polysilicon layer. A movable micromechanical structure with a seismic mass 30 and suspension springs 50, which enable a deflection of the mass in a straight line in a first direction z, is formed in the second silicon layer and anchored to the underlying substrate by means of an anchoring 40. A third polysilicon layer P3, which forms a measuring electrode 10, the top electrode, is arranged above the second polysilicon layer.

Figures 3B, 3C:
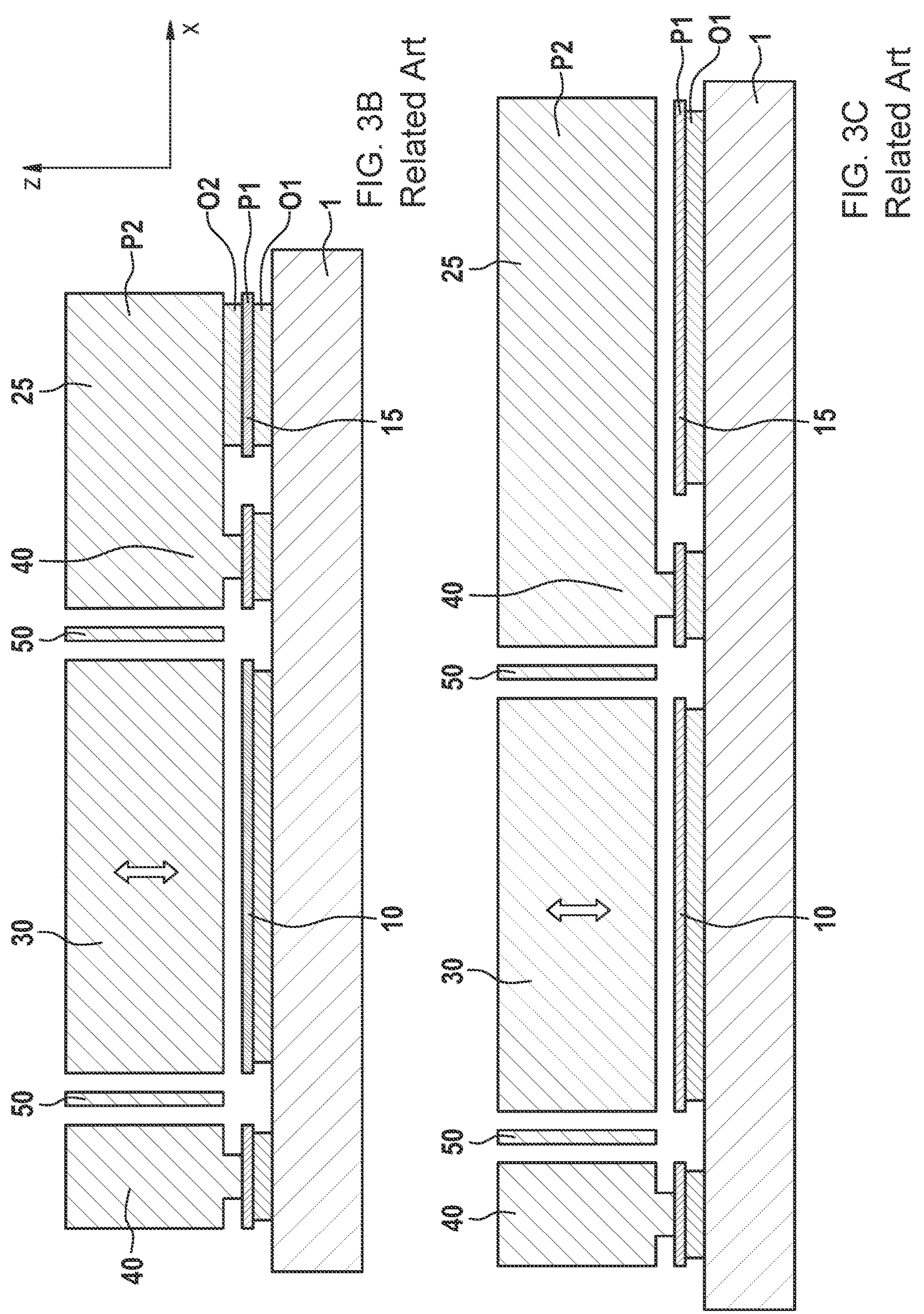
FIGS. 3B and 3C in each case schematically show in cross-section a z-acceleration sensor with two polysilicon layers, with a micromechanical trampoline structure, with a measuring capacitance and a reference capacitance next to a seismic mass in the related art.

FIGS. 3B and 3C schematically show a cross-section of a respective z-acceleration sensor with two polysilicon layers, with a micromechanical trampoline structure, with a measuring capacitance and a reference capacitance next to a seismic mass in the related art.

FIG. 3B shows a sensor with a substrate 1 with a main extension plane (x, y) and, thereon, parallel to the extension plane, a layer sequence of a first oxide layer O1, a first polysilicon layer P1, a second oxide layer O2, and a thick second polysilicon layer P2. A measuring electrode 10 and a lower reference electrode 15 are formed in the first polysilicon layer. A movable micromechanical structure having a seismic mass 30 and suspension springs 50 is formed in the second polysilicon layer P2. The seismic mass can be deflected in a straight line in the z-direction and is suspended from anchorings 40 by means of the suspension springs. The seismic mass and the upper reference electrode are arranged next to one another as viewed parallel to the extension plane. The second oxide layer O2 is arranged between the upper reference electrode 25 and the lower reference electrode 15 and represents the dielectric of this capacitor structure.

FIG. 3C shows a sensor similar to that shown in FIG. 3B. In contrast, there is an empty gap here between the upper reference electrode 25 and the lower reference electrode 15, and the atmosphere located there thus represents the dielectric of this capacitor structure.

Figure 4A:
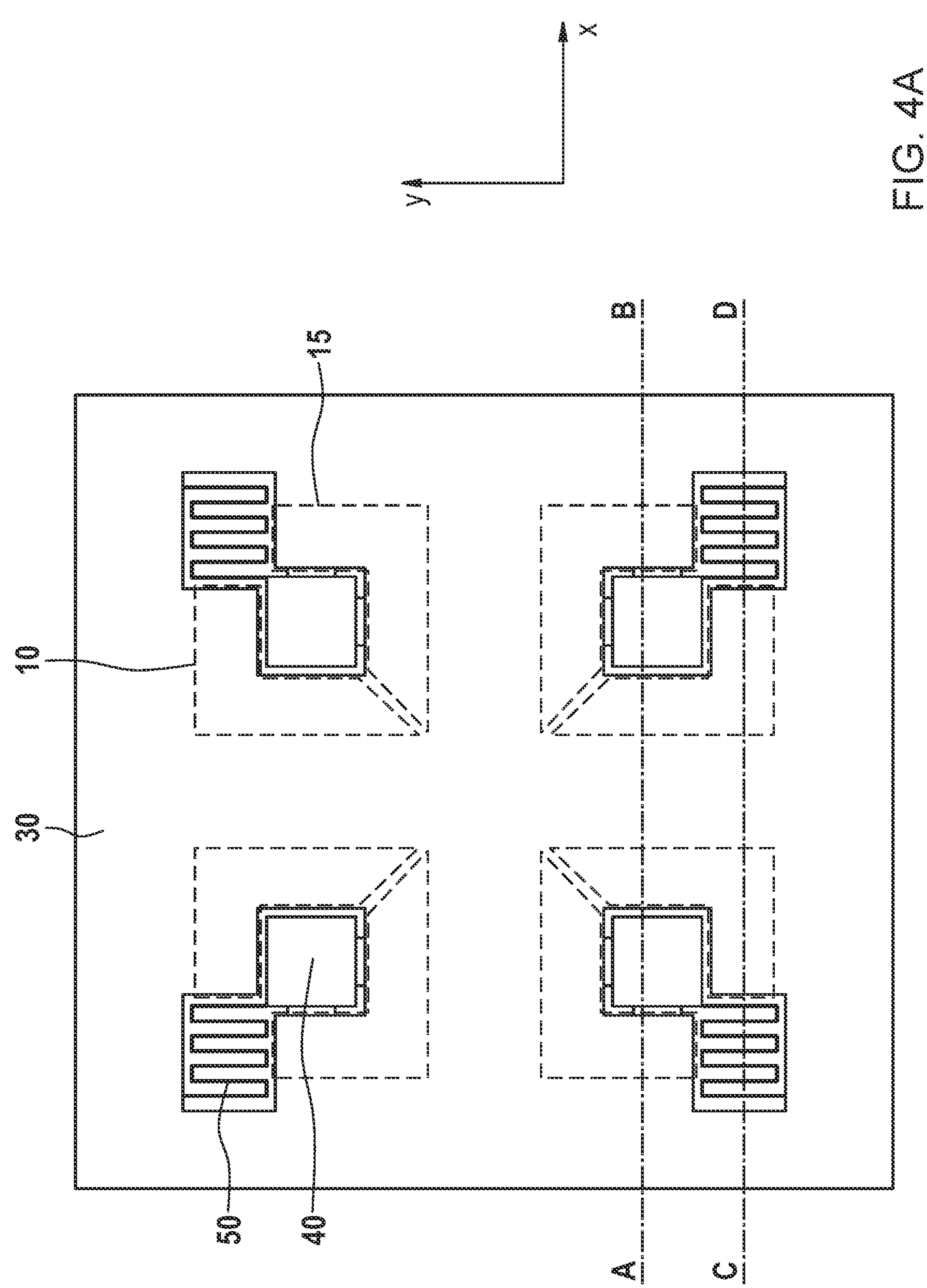
FIGS. 4A to 4C schematically show a plan view and two sections of a z-acceleration sensor according to the present invention with three polysilicon layers, with a micromechanical trampoline structure, with a measuring capacitance and a reference capacitance below a seismic mass in a first exemplary embodiment.
Figures 4B, 4C:
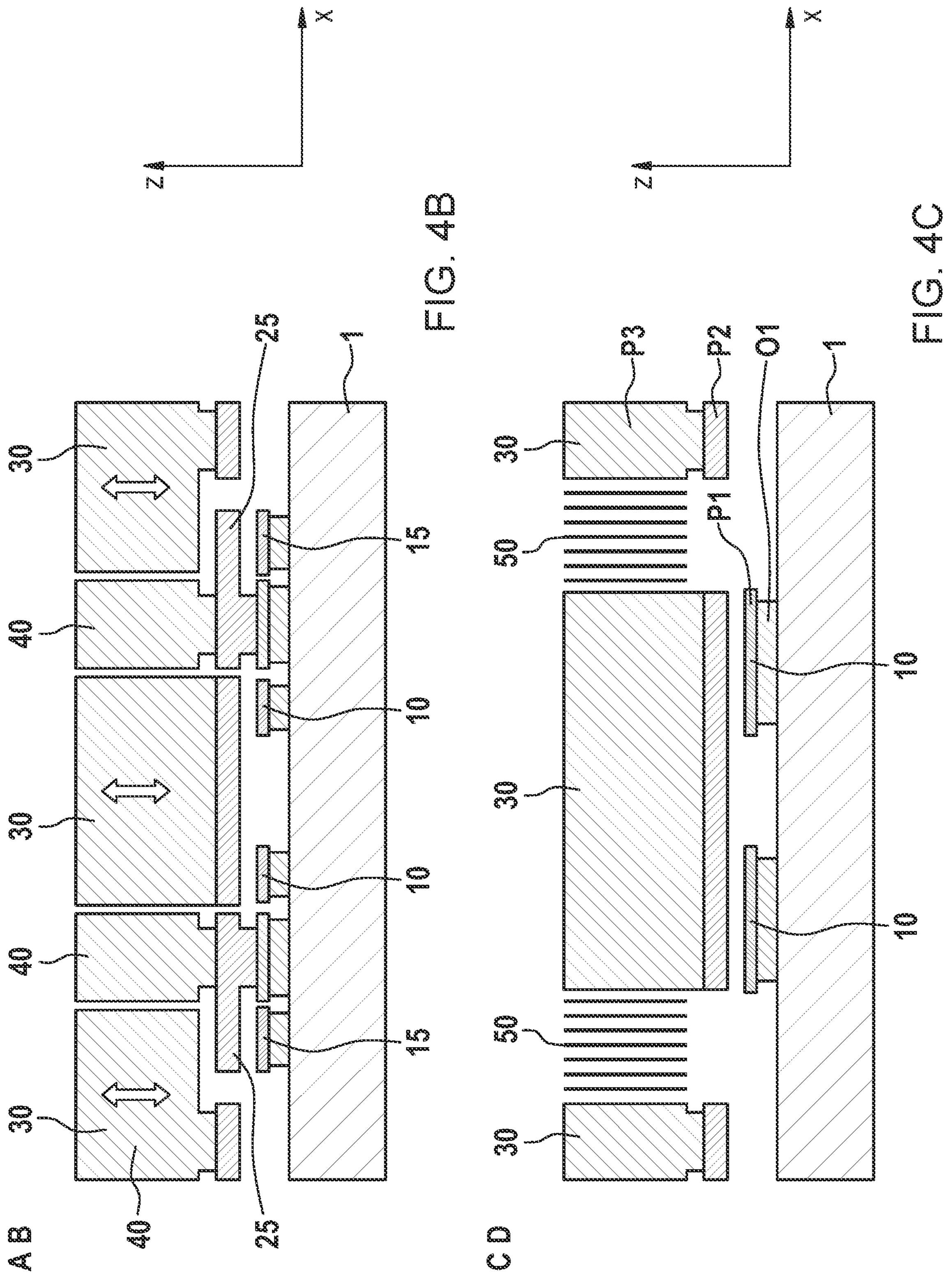

FIGS. 4A to 4C schematically show a plan view and two sections of a z-acceleration sensor according to the present invention with three polysilicon layers, with a micromechanical trampoline structure, with a measuring capacitance and a reference capacitance below a seismic mass in a first exemplary embodiment. FIG. 4A shows the plan view, and FIGS. 4B and 4B represent sections along the lines A-B and C-D shown in FIG. 4A.

Shown is a sensor with a substrate 1 with a main extension plane (x, y) and a layer sequence which is arranged thereon parallel to the extension plane and consists of a first oxide layer O1 and a first polysilicon layer P1, a second polysilicon layer P2 above the first polysilicon layer and a thick third polysilicon layer P3 above the second polysilicon layer. A movable micromechanical structure having a seismic mass 30 and four suspension springs 50 is formed in the second and third polysilicon layers. The movable micromechanical structure is fastened to four anchorings 40 by means of the suspension springs. The suspension of the structure is designed in such a way that the seismic mass can be deflected in a straight line in a first direction z perpendicular to the extension plane (x, y) . Measuring electrodes 10 and lower reference electrodes 15 are formed in the first polysilicon layer P1. Upper reference electrodes 25 are formed in the second polysilicon layer P2 and are each suspended from an anchoring 40. A measuring capacitance is in each case formed between the seismic mass 30 and a measuring electrode 10.

A reference capacitance is in each case formed between a lower reference electrode 15 and an upper reference electrode 25.

As viewed in the first direction z, the movable micromechanical structure overlaps the upper reference electrode and thus also the lower reference electrode.

During accelerations in the z-direction, the mass is deflected in the z-direction. The distance change and the associated capacitance change is measured by means of the evaluation electrodes realized in the P1 layer. In the exemplary embodiment in FIGS. 4A-4C, evaluation electrodes are arranged in four separate regions in the vicinity of the anchorings. In the region of the evaluation electrodes, the seismic mass is realized in the P3 layer and in the P2 layer, and the evaluation capacitance C1 is thus defined by the gap between the P2 layer and the P1 layer. Furthermore, reference electrodes (likewise four in this exemplary embodiment) are arranged below the seismic mass, wherein the upper reference electrodes are realized in the P2 layer and the reference bottom electrodes are realized in the P1 layer so that the reference capacitance C2 forms between the surfaces facing one another. The reference capacitance is thus defined, just like the evaluation capacitance, by the gap between the P2 layer and the P1 layer. In the particularly preferred embodiment in FIGS. 4A-4C (see in particular partial image FIG. 4B), the sacrificial oxide between the upper reference electrode and the reference bottom electrode is removed. The reference capacitance C2 therefore has not only the same gap but also the same geometry and dimensioning in the x-y plane as the evaluation electrode; this also includes the perforation holes in the P2 layer. This results in a very good match of evaluation capacitance C1 and reference capacitance C2. In contrast to the related art described in FIGS. 3B and 3C, portions of the seismic mass can be arranged above the reference electrodes in the P3 layer, i.e., the surface in the region of the reference electrodes is used twice over so to speak.

The upper reference electrodes must be at the same electrical potential as the movable mass. In order to minimize the effort and surface requirement in the electrical wiring, the upper reference electrodes are preferably directly connected to the anchorings for the mass structure. This also has the advantage that evaluation electrodes and reference electrodes are arranged in the immediate proximity of the anchorings. Mechanical stress, which causes substrate deformations, will therefore only lead to insignificant distance changes in the region of the evaluation and reference electrodes. In addition, the already small distance changes at evaluation and reference electrodes due to their immediate proximity are substantially in the same direction and of a very similar magnitude so that no significant capacitance differences C1−C2 are formed due to mechanical stress. Despite its trampoline structure, the sensor thus has very good offset stability.

The size of the seismic mass is hardly reduced by the presence of the reference electrodes, and the sensor therefore has a very high mass (in relation to the sensor core surface area) and thus very low Brownian noise. Since the sensor moves translationally in the z-direction, the full movement amplitude enters into the distance change at the evaluation electrodes, in contrast to z-rockers, see p. 2. This leads to a mechanical sensitivity dz/da that is increased in comparison to rocker designs, and—since the mechanical sensitivity enters as a factor into the electrical sensitivity dC/da (dC/da=dC/dz*dz/da)—to an increased electrical sensitivity, which has a reducing effect on the electronic noise. If no increase in the electrical sensitivity is required (because, for example, Brownian noise strongly dominates, i.e., no substantial improvement in the total noise can be achieved by reducing the electronic noise), the electrode sensitivity dC/dz can alternatively be reduced due to the increased mechanical sensitivity, either by designing the electrode surface to be smaller or by enlarging the gap between the P1 layer and the P2 layer. The latter can in particular be a valuable option if a rotation rate sensor and/or a standard acceleration sensor, which is optimized rather for high offset stability and vibration robustness than for extremely low noise values, are additionally to be arranged on the same chip. In an extremely low-noise acceleration sensor in rocker structure, chip integration would be difficult since, in the rocker structure, in order to achieve a sufficiently high electrical sensitivity, the gap for the evaluation capacitances must be selected to be very small in order to achieve a high electrode sensitivity dC/dz and thus a high electrical sensitivity dC/da despite the low mechanical sensitivity dz/da. On the other hand, rotation rate sensors and standard acceleration sensors are usually equipped with considerably larger sacrificial oxide thicknesses and electrode gaps. Considerable additional outlay in terms of process technology would be required to realize different sacrificial oxide thicknesses and thus electrode gaps for the rotation rate sensor and the standard acceleration sensor on the one hand and the extremely low-noise acceleration sensor on the other hand. However, unlike rocker structures, the trampoline arrangement according to the present invention can manage very well with larger electrode gaps and is therefore particularly well-suited for integrating an extremely low-noise acceleration sensor with a rotation rate sensor or a conventional acceleration sensor.

Figure 5:
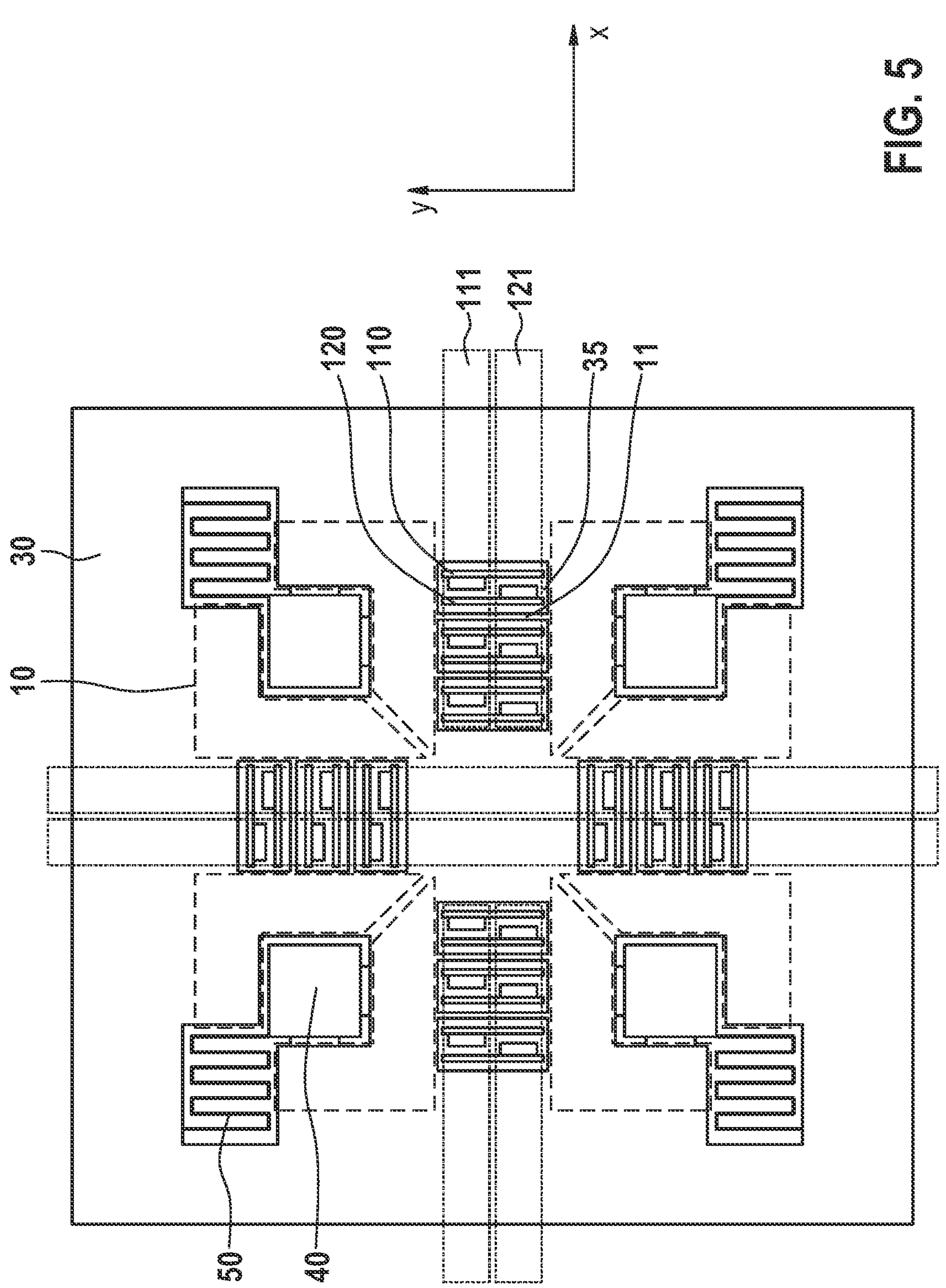
FIG. 5 schematically shows a plan view of a z-acceleration sensor according to the present invention with two further measuring axes in a second exemplary embodiment.

FIG. 5 schematically shows a plan view of a z-acceleration sensor according to the present invention with two further measuring axes in a second exemplary embodiment.

In contrast to the exemplary embodiment in FIG. 4A, the movable micromechanical structure has recesses in the seismic mass 30, in which recesses electrode fingers 11 are arranged, which together with first fixed electrodes 110 and second fixed electrodes 120 represent differential measuring capacitances for measuring accelerations of the seismic mass in the x-direction and y-direction. If the suspension springs 50 are designed in such a way that resilience is ensured not only in the z-direction but also in the x- and y-directions, a three-axis acceleration sensor with a common seismic mass can be realized in this way. The seismic mass can deflect translationally in all three spatial directions and therefore fully acts in a noise-reducing manner in the x-, y- and z-directions, similarly to how this is the case in the related art U.S. Pat. No. US 6,892,576 B2. In this exemplary embodiment, the fixed electrodes for x- and y-detection are fastened individually to first and second conductive path leads 110, 120, and the conductive path leads are realized in the P1 layer or in the P2 layer. Other embodiments of the x- and y-electrodes, for example with a common suspension point for a plurality of electrode fingers, as shown in German Patent Application Nos. DE 10 2009 045 391 A1 and DE 10 2012 200 740 A1, are also possible within the meaning of the present invention.

Figure 6A:
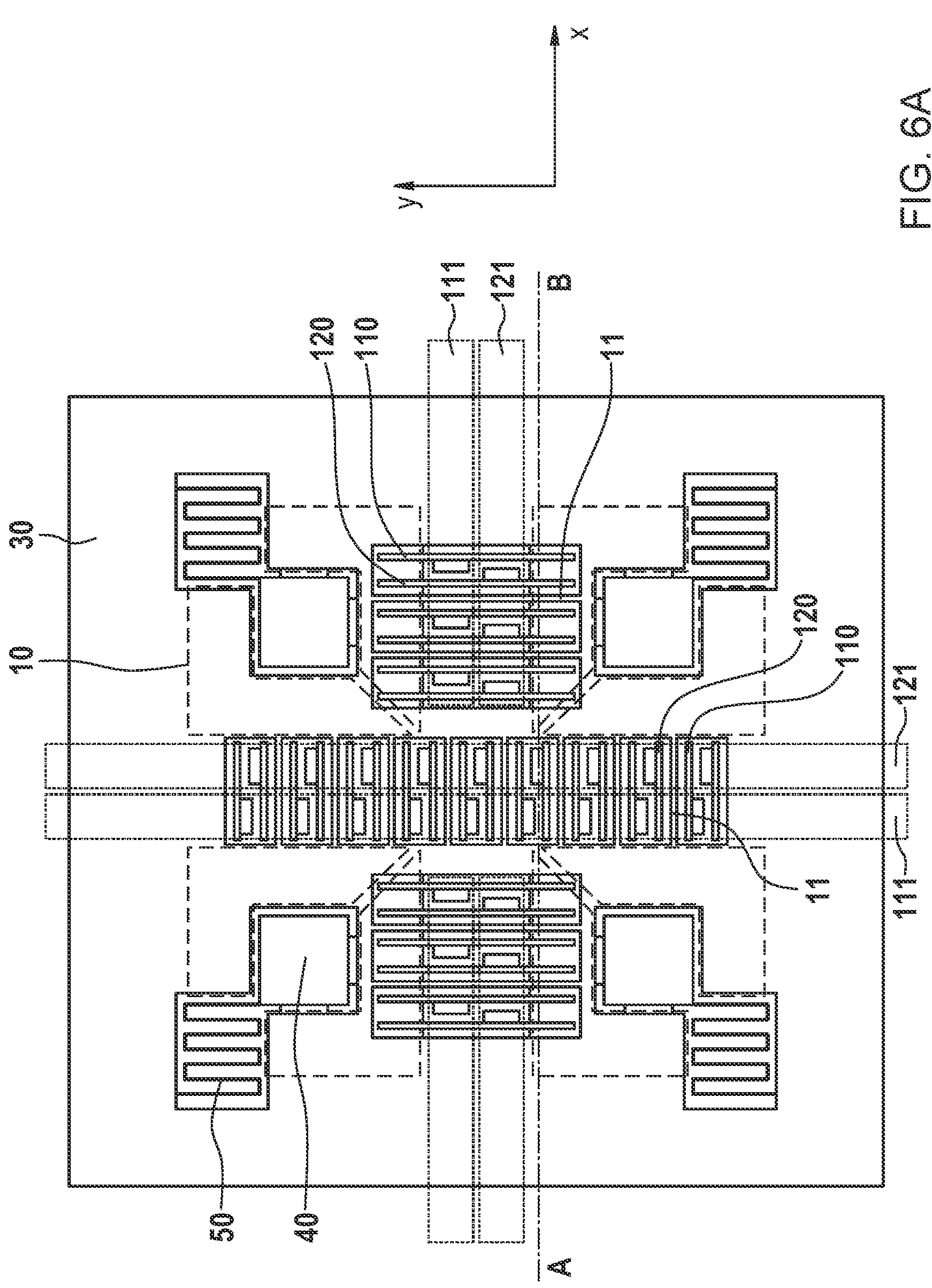

FIGS. 6A and 6B schematically show a plan view and a section of a z-acceleration sensor according to the present invention with two further measuring axes in a third exemplary embodiment. This is a three-channel acceleration sensor that is based on the structure in FIG. 5. Here, the capacitance of the electrode fingers has been increased by arranging further electrode cells effective in the y-direction, i.e., further electrode fingers 11, while the length of the electrode fingers 11 rather than the number of effective electrode cells has been increased in the x-direction.

In particular, it is advantageously possible to arrange the electrode fingers in a partially overlapping manner above the upper reference electrodes for the z-detection. This also achieves a double surface area utilization, so to speak, by forming the evaluation capacitance for the x-detection above the reference capacitance for the z-detection. In this way, the sensor can be produced in a particularly compact manner, i.e., on a small chip surface, and thus particularly cost-effectively.

Furthermore, according to the present invention, it is basically possible (not shown in the figures) to arrange the springs in an at least partially overlapping manner above the fixed reference electrode. A double surface area utilization and a particularly compact arrangement can be achieved in this way as well.

When creating a three-axis acceleration sensor with a common seismic mass, one of the essential challenges is to suitably balance out the mechanical transfer function with regard to frequency and damping on the one hand and the electrical sensitivity of the three measuring axes x, y, z on the other hand or to adapt them to one another. For this purpose, it is in particular necessary to select spring structures that have the desired (i.e., in many cases, mutually similar) mechanical stiffnesses in the x-, y- and z-directions. FIGS. 4A-6B in each case show a generic meander spring type, which is formed by a plurality of longer parallel spring legs and a plurality of shorter spring legs arranged perpendicularly thereto.

Figures 7A, 7B, 7C:
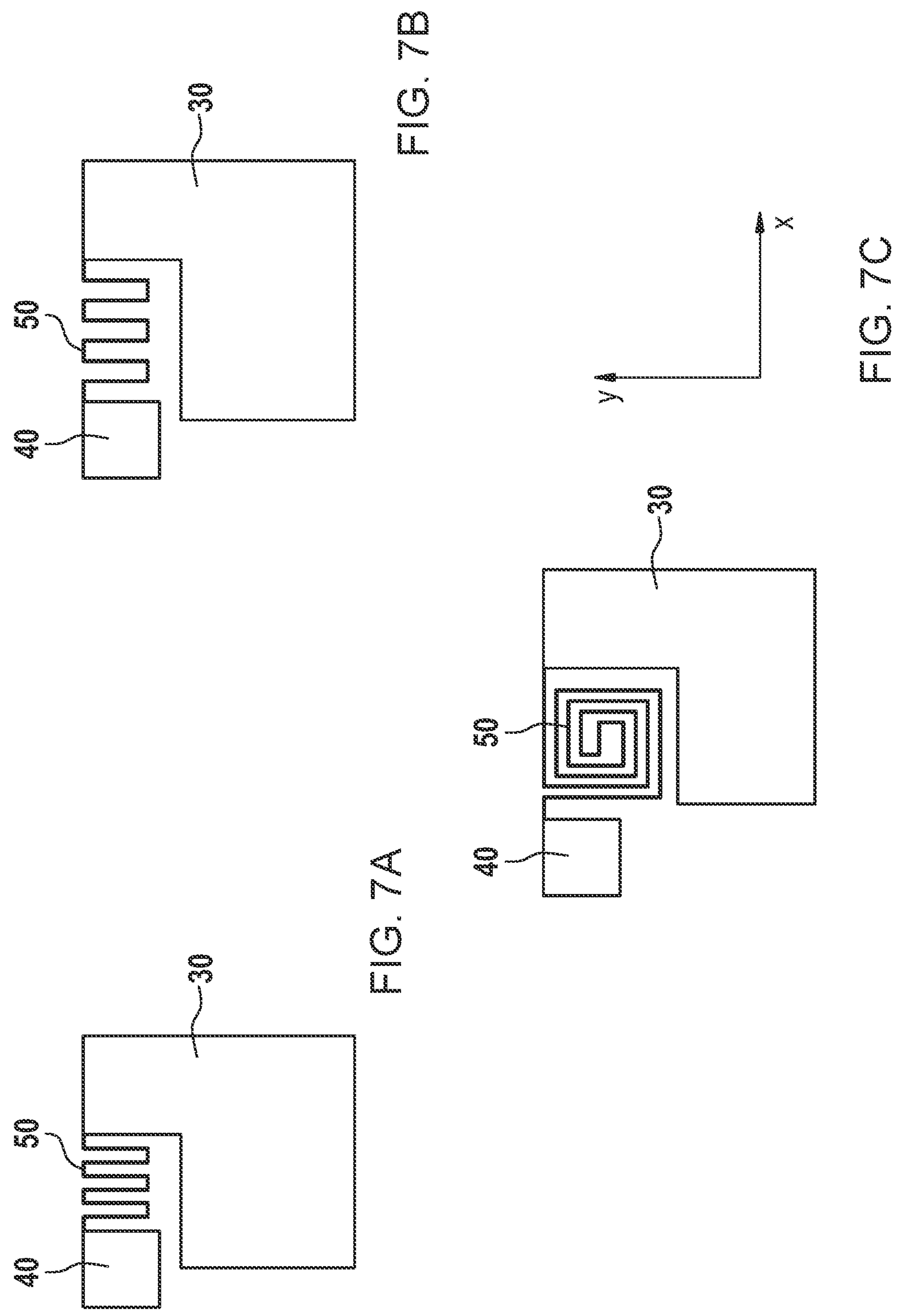
FIGS. 7A to 7C schematically show a plan view of spring arrangements for suspending the trampoline structure of a z-acceleration sensor according to the present invention.

FIGS. 7A to 7C schematically show a plan view of spring arrangements for suspending the trampoline structure of a z-acceleration sensor according to the present invention.

FIG. 7A shows the spring structure 50, from FIGS. 4A to 6C, in the form of a compact meander spring along with the anchoring 40 and a section of the seismic mass 30. Such a meander spring is basically resilient in all three spatial directions.

By extending the short spring legs (FIG. 7B), which are also subjected to torsion during a z-movement, the z-stiffness can be considerably reduced without significantly influencing the x-stiffness, for example. Depending on the layer thickness of the spring, in particular at relatively high typical layer thicknesses of 20-40 μm, it can nevertheless be technically difficult to construct a meander spring that is sufficiently soft in the z-direction.

The use of so-called spiral springs is therefore particularly advantageous in connection with the present invention. These springs have a spiral structure with a plurality of spring legs, or round or elliptically shaped spiral arms, arranged at an angle to one another. FIG. 7C shows an angled spiral spring by way of example. The spiral shape allows a particularly high resilience of the spring in the z-direction in comparison to the x- and y-directions. This is important since the thickness of the third polysilicon layer P3 in which the springs are substantially formed is considerably larger than the width of typical spring legs. Simple beams with, for example, a 20-40 μm height and a 2-4 μm width can therefore basically be substantially more easily deflected in the x- or y-directions than in the z-direction. High resilience in the z-direction in comparison to the x- or y-directions can, however, be achieved with relatively wide spring legs in spiral form because the x-/y-stiffness of the spiral spring scales with the third power of the spring width, whereas the z-stiffness only scales with linear power. Advantageously, the mechanical and/or electrical sensitivity of the acceleration sensor in all three spatial directions can thereby be easily adapted or matched to one another.

LIST OF REFERENCE SIGNS

1 Substrate
O1 First oxide layer
O2 Second oxide layer
P1 First polysilicon layer
P2 Second polysilicon layer
P3 Third polysilicon layer
10 Measuring electrode
11 Electrode finger
15 Lower reference electrode
25 Upper reference electrode
30 Seismic mass
35 Recess
40 Anchoring
50 Suspension spring
110 First fixed electrodes
111 First circuit board conductor
120 Second fixed electrodes
121 Second circuit board conductor

What is claimed is:

1. A micromechanical capacitive z-acceleration sensor, comprising:

a substrate with a main extension plane, and a layer sequence which is parallel to the extension plane and includes a first polysilicon layer above the substrate, a second polysilicon layer above the first polysilicon layer, and a third polysilicon layer above the second polysilicon layer;

a movable micromechanical structure having a seismic mass which can be deflected in a straight line in a first direction perpendicular to the extension plane, the movable micromechanical structure being formed in the second polysilicon layer and the third polysilicon layer;

a measuring capacitance formed between the seismic mass and a measuring electrode, the measuring electrode being formed in the first polysilicon layer;

wherein a reference capacitance is formed between a lower reference electrode and an upper reference electrode, the lower reference electrode being formed in the first polysilicon layer, and the upper reference electrode being formed in the second polysilicon layer;

wherein, as viewed in the first direction, the movable micromechanical structure at least partially overlaps the upper reference electrode.

2. The micromechanical capacitive z-acceleration sensor according to claim 1, wherein the movable micromechanical structure is anchored to the substrate using at least one anchoring.

3. The micromechanical capacitive z-acceleration sensor according to claim 2, wherein the at least one anchoring includes four anchorings.

4. The micromechanical capacitive z-acceleration sensor according to claim 2, wherein the upper reference electrode is suspended from the anchoring.

5. The micromechanical capacitive z-acceleration sensor according to claim 2, wherein the movable micromechanical structure has at least one suspension spring, and the seismic mass is suspended from the anchoring using the suspension spring.

6. The micromechanical capacitive z-acceleration sensor according to claim 5, wherein the movable micromechanical structure, as viewed in the first direction, has a centroid of area, and the anchoring is arranged closer to the centroid of area than is the suspension spring.

7. The micromechanical capacitive z-acceleration sensor according to claim 5, wherein, as viewed in the first direction, the seismic mass at least partially overlaps the upper reference electrode.

8. The micromechanical capacitive z-acceleration sensor according to claim 5, wherein, as viewed in the first direction, the suspension spring and the upper reference electrode overlap at least partially.

9. The micromechanical capacitive z-acceleration sensor according to claim 5, wherein the seismic mass can be deflected in a second direction parallel to the extension plane and/or in a third direction parallel to the extension plane and has electrode fingers for detecting a deflection in the first and/or second direction.

10. The micromechanical capacitive z-acceleration sensor according to claim 9, wherein, as viewed in the first direction, the electrode fingers and the upper reference electrode overlap at least partially.

* * * * *